United States Patent
Yamamoto et al.

(10) Patent No.: US 10,157,957 B2
(45) Date of Patent: Dec. 18, 2018

(54) METHOD OF MANUFACTURING A CURVED SOLID-STATE IMAGING ELEMENT

(71) Applicant: SONY CORPORATION, Tokyo (JP)

(72) Inventors: Yuichi Yamamoto, Kanagawa (JP); Kojiro Nagaoka, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 15/023,832

(22) PCT Filed: Sep. 16, 2014

(86) PCT No.: PCT/JP2014/074363
§ 371 (c)(1),
(2) Date: Mar. 22, 2016

(87) PCT Pub. No.: WO2015/045933
PCT Pub. Date: Apr. 2, 2015

(65) Prior Publication Data
US 2016/0240582 A1    Aug. 18, 2016

(30) Foreign Application Priority Data

Sep. 30, 2013 (JP) ................................ 2013-204318

(51) Int. Cl.
*H01L 27/146* (2006.01)
*H04N 5/225* (2006.01)
*G02B 13/00* (2006.01)

(52) U.S. Cl.
CPC .... *H01L 27/14687* (2013.01); *G02B 13/0085* (2013.01); *H01L 27/14607* (2013.01);
(Continued)

(58) Field of Classification Search
CPC ........ H01L 27/14607; H01L 27/14683; H04N 5/2253
See application file for complete search history.

(56) References Cited

U.S. PATENT DOCUMENTS 4,233,645 A * 11/1980 Balderes ............. H01L 23/3733
174/16.3
2003/0054188 A1* 3/2003 Ishikawa ............... C04B 41/009
428/539.5
(Continued)

FOREIGN PATENT DOCUMENTS

JP    2005-191218    *    7/2005

OTHER PUBLICATIONS

Machine language translation of JP 2005-191218.*

*Primary Examiner* — Erik Kielin
(74) *Attorney, Agent, or Firm* — Chip Law Group

(57) ABSTRACT

The present disclosure relates to a solid-state imaging element in which the cost reduction of a curved imaging element can be achieved, a method for manufacturing the solid-state imaging element, and an electronic apparatus. A curvature base is formed so as to be curved in a concave shape at a center leaving a small edge. The curvature base is divided into five portions of an element disposition portion and four peripheral portions. This element disposition portion is formed in a porous state. A pore (air bubble) in the porous state is smaller than a pixel size. A porous material such as a ceramic-based material, a metal-based material, or a resin-based material can be used as the porous material, for example. The present disclosure can be applied to a CMOS solid-state imaging element to be used for an imaging device, for example.

16 Claims, 12 Drawing Sheets

(52) U.S. Cl.
CPC .. *H01L 27/14627* (2013.01); *H01L 27/14683* (2013.01); *H04N 5/2253* (2013.01)

(56) References Cited

U.S. PATENT DOCUMENTS

| | | | | |
|---|---|---|---|---|
| 2005/0109918 | A1* | 5/2005 | Nikzad | H01L 27/14683 250/208.1 |
| 2006/0056830 | A1* | 3/2006 | Tanaka | G03B 17/00 396/55 |
| 2012/0299140 | A1* | 11/2012 | Sekine | H01L 27/14607 257/432 |

* cited by examiner

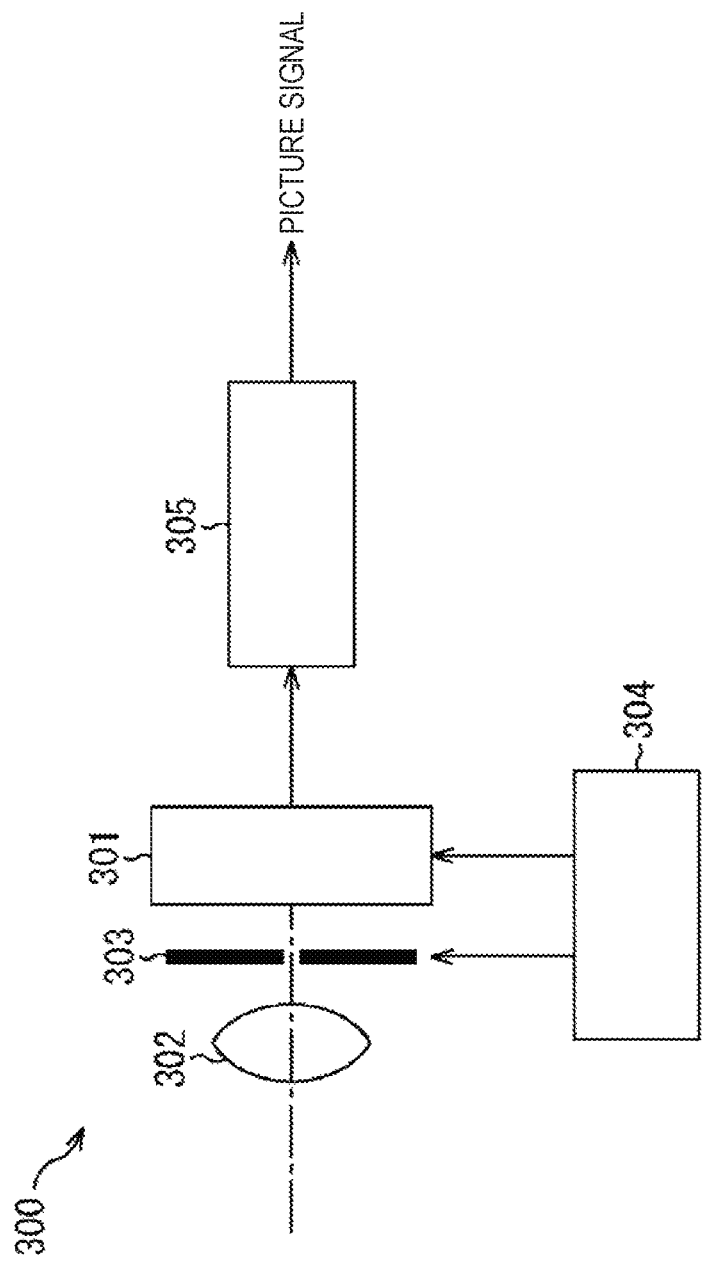

METHOD OF MANUFACTURING A CURVED SOLID-STATE IMAGING ELEMENT

TECHNICAL FIELD

The present disclosure relates to a solid-state imaging element, a method for manufacturing the solid-state imaging element, and an electronic apparatus, and, in particular, relates to a solid-state imaging element in which the cost reduction of a curved imaging element is achieved, a method for manufacturing the solid-state imaging element, and an electronic apparatus.

BACKGROUND ART

An imaging device such as a camera which combines a solid-state imaging element and an imaging lens is configured to include the imaging lens disposed on the light receiving face side of the solid-state imaging element. In such an imaging device, when an object image is formed by the imaging lens, the shift of focusing position occurs between the central part and the peripheral part of an imaging face by lens aberration called field curvature.

Accordingly, it has been proposed a configuration of forming a curved face curved in three-dimensional shape according to the field curvature of the imaging lens and arranging electro-optical conversion units on this curved face to form the imaging face (light receiving face) of the solid-state imaging element. Thereby, it becomes unnecessary to correct the field curvature (lens aberration) using a combination of a plurality of lenses. For example, the following two methods are disclosed as a method for manufacturing the solid-state imaging element in which the electro-optical conversion units are arranged on such a curved face.

Patent Literature 1 discloses a method for preparing a base formed to have an opening and a flat face formed around the opening, mounting an element chip on the flat face of the base in the state that the opening is closed so as to make a major face side on which the electro-optical conversion units are arranged be directed upward, and then shrinking the volume inside the opening of the base closed by the element chip in the state that the element chip is fixed on the flat face of the base.

Patent Literature 2 discloses a method for aligning active elements on abuse substrate having a curved portion, providing a film and a cover so as to cover the base substrate and the active elements, deforming the film by air pressure through holes provided in the cover so as to pressurize the active elements indirectly, and making the active elements deform to match the curved portion of the base substrate.

CITATION LIST

Patent Literature

Patent Literature 1: JP 2012-182243A
Patent Literature 2: JP 2005-260436A

SUMMARY OF INVENTION

Technical Problem

However, in the method for shrinking the volume inside the opening of the base closed by the element chip in the state that the element chip is fixed on the flat face of the base, it is necessary to provide a margin for the curvature (flat face). Accordingly, the chip size becomes larger and the theoretical yield becomes low.

Further, in the method for deforming the film by air pressure through the holes of the cover so as to pressurize the active elements indirectly and making the active elements deform to match the curved portion of the base substrate, it is difficult to align the active elements with the base substrate and the curvature yield is low.

The present disclosure has been achieved in view of such a situation, and can achieve the cost reduction of the curved imaging element.

Solution to Problem

According to an aspect of the present technology, there is provided a solid-state imaging element mounted in a curved state on a base including a porous portion.

The base may include a metal film formed inside the porous portion.

The base may have a stacked structure of a porous material and a metal.

The base may be formed of a porous ceramic-based material.

The base may be formed of a porous metal-based material.

The base may be formed of a porous resin-based material.

The base may be curved at a center and configured to include the porous portion and the other peripheral portion which is removed in manufacturing.

According to an aspect of the present technology, there is provided a method for manufacturing a solid-state imaging element, the method including: aligning, to a base which is curved at a center and configured to include a porous portion and the other peripheral portion, a protection tape having a size of the base, a solid-state imaging element being pasted on the protection tape; making the solid-state imaging element adhere to the porous portion by extracting air from the porous portion; and removing the peripheral portion from the base and peeling off the protection tape.

The solid-state imaging element can be made to adhere to the porous portion by extracting air from the porous portion by suction.

Air can be extracted gradually from a circumference to a center of the solid-state imaging element.

The solid-state imaging element can be made to adhere to the porous portion by extracting air from the porous portion by pressurization from above the protection tape.

Air can be extracted gradually from a center to a circumference of the solid-state imaging element.

The porous portion may include a metal film formed inside the porous portion.

The porous portion may have a stacked structure of a porous material and a metal.

The porous portion may be formed of a ceramic-based material.

The porous portion may be formed of a metal-based material.

The porous portion may be formed of a resin-based material.

According to an aspect of the present technology, there is provided an electronic apparatus, including: a solid-state imaging element mounted in a curved state on a porous base; a signal processing circuit that processes an output signal output from the solid-state imaging element; and an optical system that makes incident light enter the solid-state imaging element.

In an aspect of the present technology, the solid-state imaging element is mounted in the curved state on the base including the porous portion.

Advantageous Effects of Invention

According to the present technology, it becomes possible to manufacture a curved imaging element. Further, according to the present technology, it becomes possible to achieve the cost reduction of the curved imaging element.

Note that the advantageous effect described in the present specification is only an exemplification, and the advantageous effect of the present technology is not limited to the advantageous effect described in the present specification and there may be an additional advantageous effect.

BRIEF DESCRIPTION OF DRAWINGS

FIG. 12 is a block diagram to illustrate a configuration example for an electronic apparatus of a sixth embodiment in the present technology.

DESCRIPTION OF EMBODIMENTS

Hereinafter, modes for carrying out the present disclosure (in the following, called embodiments) will be explained. Here, the explanation will be made in the following order.

0. Schematic Configuration Example of a Solid-State Imaging Element

1. First embodiment (an example of a fundamental curvature base in the present technology)

2. Second embodiment (another example of the curvature base)

3. Third embodiment (another example of the curvature base)

4. Fourth embodiment (another example of the curvature base)

5. Fifth embodiment (another example of the curvature base)

6. Sixth embodiment (an example of an electronic apparatus)

0. Schematic Configuration Example of a Solid-State Imaging Element

<Schematic Configuration Example of a Solid-State Imaging Element>

Figure 1:
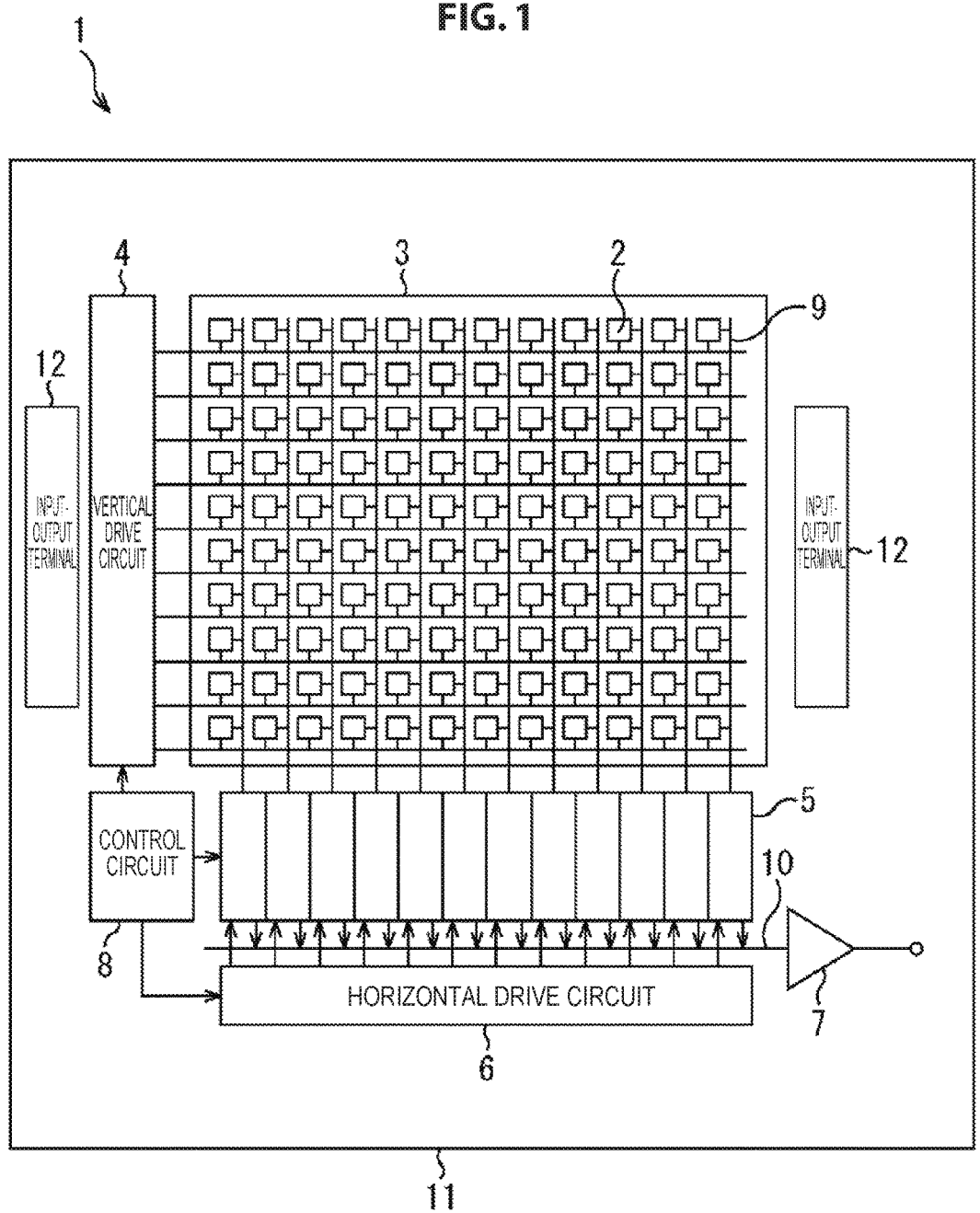
FIG. 1 is a block diagram to illustrate a schematic configuration example of a solid-state imaging element to which the present technology is applied.

FIG. 1 illustrates a schematic configuration example for an example of a complementary metal oxide semiconductor (CMOS) solid-state imaging element which is applied to each of embodiments of the present technology.

As illustrated in FIG. 1, a solid-state imaging element (element chip) 1 includes a pixel region (so-called imaging region) 3 where pixels 2 including a plurality of electro-optical conversion elements are arranged two-dimensionally in a regular form on a semiconductor substrate 11 (e.g., silicon substrate) and a peripheral circuit unit.

Each of the pixels 2 includes the electro-optical conversion element (e.g., photodiode) and a plurality of pixel transistors (so-called MOS transistors). The plurality of pixel transistors can be configured to include three transistors of a transfer transistor, a reset transistor and an amplification transistor, for example, and further can be also configured to include four transistors by adding a selection transistor. The equivalent circuit in each of the pixels 2 (unit pixel) is similar to that of a general type and detailed explanation will be omitted here.

Further, the pixels 2 can be also configured in a pixel sharing structure. The pixel sharing structure is configured to include a plurality of photodiodes, a plurality of transfer transistors, a shared floating diffusion, and each of the other shared pixel transistors.

The peripheral circuit unit is configured to include a vertical drive circuit 4, a column signal processing circuit 5, a horizontal drive circuit 6, an output circuit 7, and a control circuit 8.

The control circuit 8 receives an input clock and instruction data to command an operation mode or the like, and outputs internal information data or the like in the solid-state imaging device 1. Specifically, the control circuit 8 generates clock signals and control signals which are references for actions in the vertical drive circuit 4, the column signal processing circuit 5, and the horizontal drive circuit 6, based on a vertical synchronization signal, a horizontal synchronization signal, and a master clock. Then, the control circuit 8 inputs these signals to the vertical drive circuit 4, the column signal processing circuit 5, and the horizontal drive circuit 6.

The vertical drive circuit 4 is configured to include a shift register, for example, and selects a pixel drive line, and supplies a pulse for driving the pixels 2 to the selected pixel drive line and drives the pixels 2 in a unit of a row. Specifically, the vertical drive circuit 4 selects the pixels 2 of the pixel region 3 in the unit of the row and scans the pixels 2 sequentially in the vertical direction, and supplies a pixel signal based on a signal charge generated according to a received light amount in the electro-optical conversion element in each of the pixels 2 to the column signal processing circuit 5 through a vertical signal line 9.

The column signal processing circuit 5 is disposed for each of columns of the pixels 2, for example, and performs signal processing such as noise removal and the like for a signal output from each of the pixels 2 of one row, in each of the pixel columns. Specifically, the column signal processing circuit 5 performs signal processing such as correlated double sampling (CDS) for removing a fixed pattern noise inherent in the pixels 2, signal amplification, analog/digital (A/D) conversion, and the like. A horizontal selection switch (not illustrated) is arranged between a horizontal signal line 10 and an output stage of the column signal processing circuit 5.

The horizontal drive circuit 6 is configured to include a shift register, for example, and selects each of the column signal processing circuits 5 in order by sequentially outputting a horizontal scan pulse to make each of the column signal processing circuits 5 output the pixel signal to the horizontal signal line 10.

The output circuit 7 performs signal processing for the signal supplied sequentially through the horizontal signal line 10 from each of the column signal processing circuits 5 and outputs the processed signal. The output circuit 7 sometimes performs only buffering but sometimes performs black level adjustment, column variation correction, various kinds of digital signal processing or the like, for example.

An input-output terminal 12 is provided for exchanging signals with the outside.

1. First Embodiment

<Configuration Example of a Curvature Base>

Figure 2:
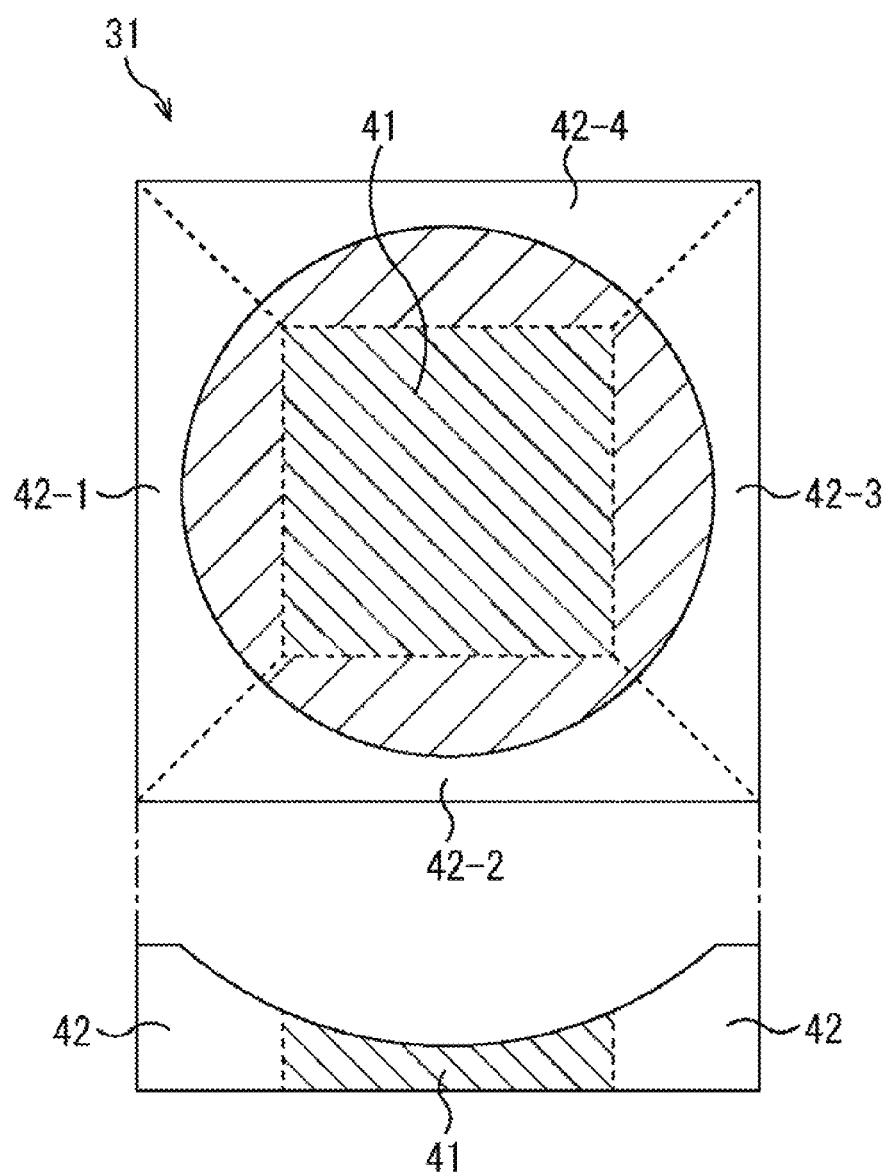
FIG. 2 is an illustration of a configuration example for a curvature base of a first embodiment in the present technology.

FIG. 2 is an illustration to show a configuration example of a curvature base used for forming a curved face curved in three-dimensional shape according to the field curvature of an imaging lens, that is, for curving the solid-state imaging element. The example of FIG. 2 illustrates a top view and a side view of a curvature base. Further, in FIG. 2, the dotted line shows that the base can be divided on this line, and the circle having hatching shows that the curvature base is curved in a concave shape.

As illustrated in FIG. 2, the curvature base 31 is curved in a concave state at the center leaving small edge portion. The curvature base 31 is configured to include an element disposition portion 41 which is a portion where the solid-state imaging element 1 of FIG. 1 is disposed and four peripheral portions 42-1 to 42-4 which are portions except the element disposition portion 41. That is, in the example of FIG. 2, the curvature base 31 is divided into five portions of the element disposition portion 41 and the four peripheral portions 42-1 to 42-4. Note that, when not necessarily discriminated in particular, the peripheral portions 42-1 to 42-4 are generally called a peripheral portion 42.

This element disposition portion 41 is formed in a porous state. Preferably pores air bubbles) in the porous state are smaller than the pixel size. Here, while the pores (air bubbles) are preferably as small as possible, and the pores being a substance itself is more preferable than artificial pores made mechanically by a person. For the pores being the substance itself, the pores are directed in various directions, and it becomes possible to suck air or to make air escape from the curved portion uniformly from either the side face or the bottom face. A porous material of a ceramic-based material, a metal-based material, or resin-based material can be used as the porous material.

The peripheral portion 42 is configured to include resin or the like, for example. Note that this is an example and the constituent material of the peripheral portion 42 is not limited in particular.

<Manufacturing Process of a Solid-State Imaging Element>

Figure 4:
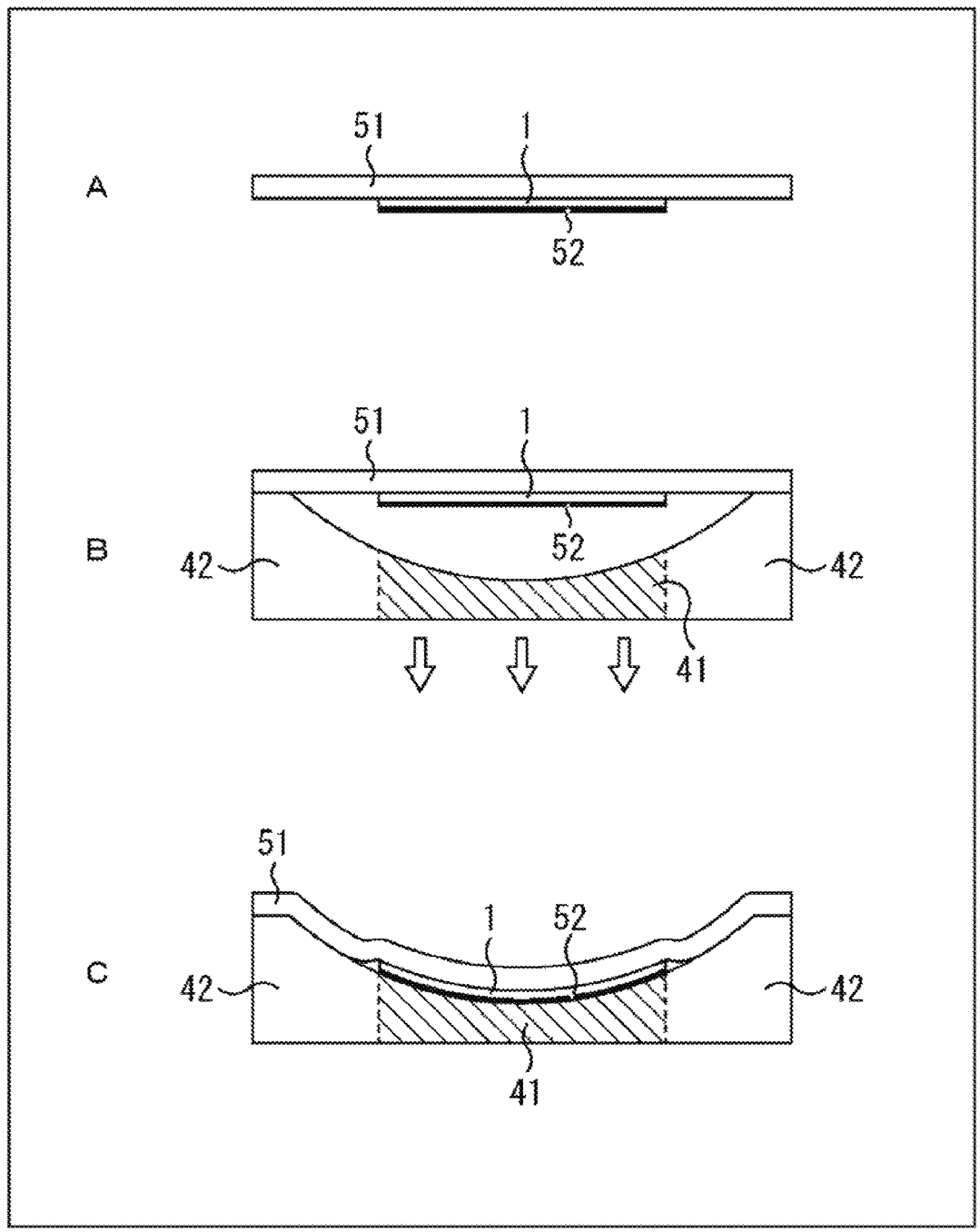
FIG. 4 is an illustration of manufacturing steps of a solid-state imaging element.
Figure 5:
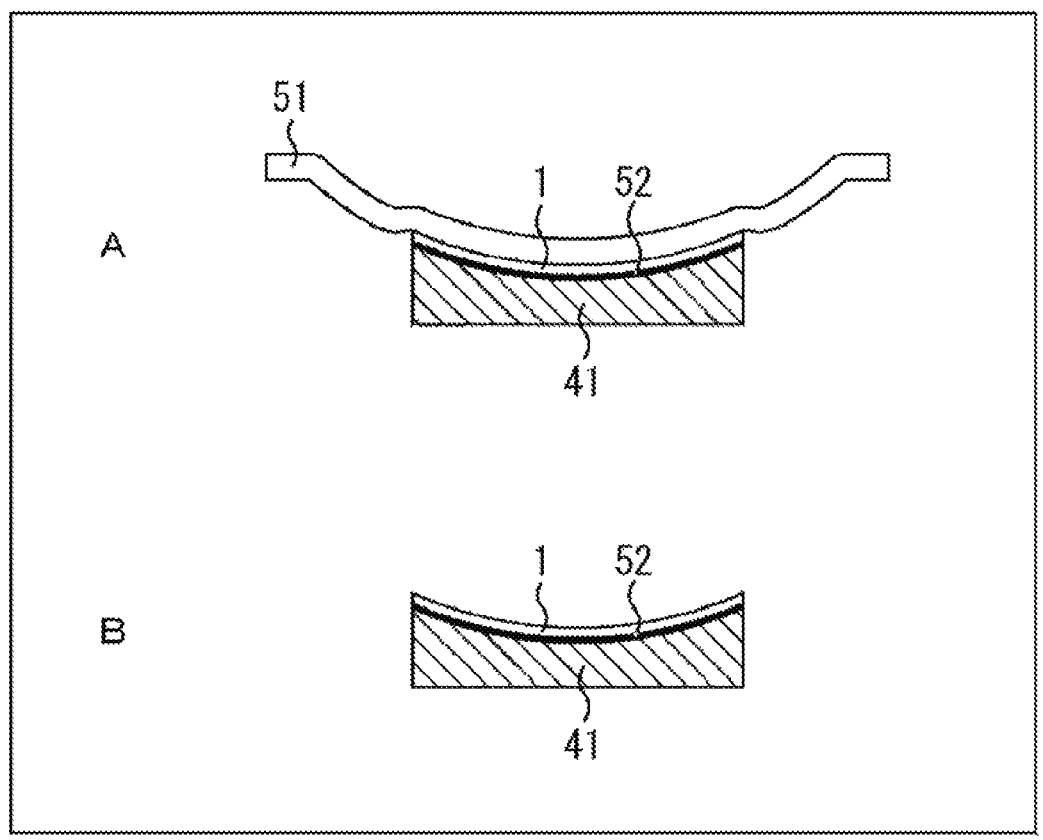
FIG. 5 is an illustration of manufacturing steps of a solid-state imaging element.

Next, with reference to a flowchart of FIG. 3 and a process diagram of FIG. 4 and FIG. 5, there will be explained a manufacturing process of the solid-state imaging element which is a process of manufacturing the solid-state imaging element curved in three-dimensional shape using the curvature base of FIG. 2. Here, this process is performed by the use of a manufacturing apparatus to manufacture the solid-state imaging element.

First, in step S11, the manufacturing apparatus disposes the curvature base 31 of FIG. 2 including the porous element disposition portion 41 where the solid-state imaging element 1 of FIG. 1 is disposed, for example.

In step S12, as illustrated in FIG. 4A, the manufacturing apparatus pastes the solid-state imaging element 1 having an adhesive layer 52 onto a protection tape 51 which is cut in a base of the same size as the size of the curvature base 31.

That is, the adhesive layer 52 is provided on the rear face (lower side face in the drawing) of the solid-state imaging element 1, and the protection tape 51 is pasted on the surface (upper face in the drawing) of the solid-state imaging element 1 so as to make both centers be aligned with each other. Here, since the protection tape 51 is cut in the same size as the curvature base 31, the protection tape 51 works as a margin. Thereby, the alignment of the curvature base 31, the solid-state imaging element 1, and the protection tape 51 is performed by the use of the outer size. Accordingly, it is possible to perform the alignment accurately.

In step S13, as illustrated by the arrows in FIG. 4B, the manufacturing apparatus extracts air from the bottom face (side) of the element disposition portion 41 in the curvature base 31 to make the solid-state imaging element 1 adhere to the curvature base 31.

Here, examples of methods for extracting air include a method for extracting air by sucking air from the bottom face (side) of the element disposition portion 41, and a method for extracting air by making air escape from the bottom face (side) of the element disposition portion 41 by pressurization from the upper side of the protection tape 51.

In the case of the former suction method, it is preferable to extract air gradually from the circumference to the center of the element disposition portion 41. On the other side, in the case of the latter pressurization method, it is preferable to extract air gradually from the center to the circumferential portion of the element disposition portion 41.

Moreover, air may be extracted from the side face (side), or both the bottom face (side) and the side face (side), not limited to the bottom face (side) of the element disposition portion 41.

According to the process of step S13, the solid-state imaging element 1 is made to adhere to the curvature base 31, as illustrated in FIG. 4C.

In step S14, the manufacturing apparatus removes the peripheral portion 42 from the curvature base 31. That is, as illustrated in FIG. 5A, only the peripheral portion 42 is removed from the curvature base 31 to which the solid-state imaging element 1 is made to adhere.

In step S15, the manufacturing apparatus peels off the protection film 15 pasted onto the solid-state imaging element 1. Thereby, as illustrated in FIG. 5B, the solid-state imaging element 1 is formed to be mounted on the porous element disposition portion 41 (base and curved according to the curve of the element disposition portion 41.

As above, the curved solid-state imaging element 1 is manufactured.

<Variation Example>

Figure 6:
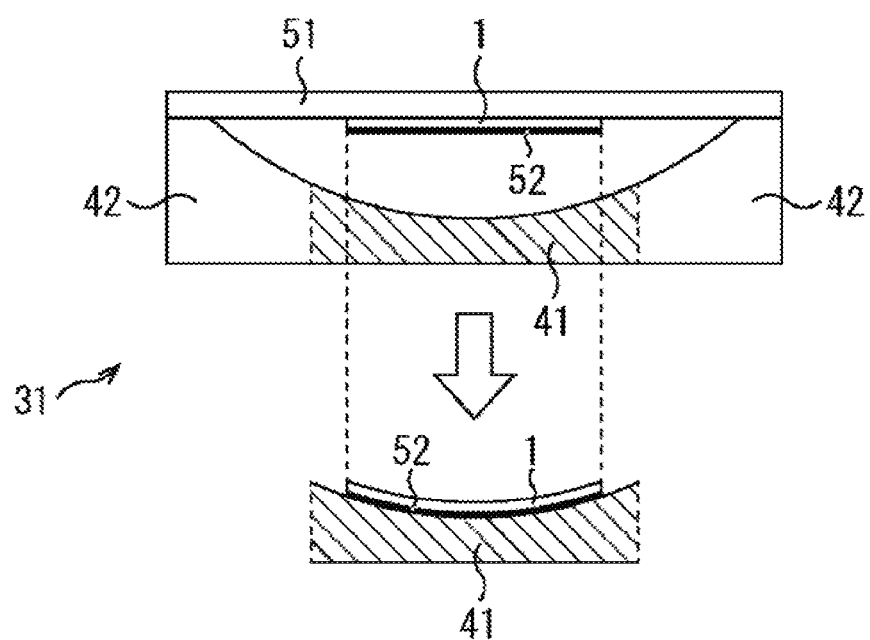
FIG. 6 is an illustration of a variation example for a solid-state imaging element.

Note that, while the above explanation explains the case that the size of the solid-state imaging element 1 is approximately the same as the size of the element disposition portion 41, as illustrated in FIG. 6, and the size of the solid-state imaging element 1 may be smaller than the size of the element disposition portion 41.

Also when the size of the solid-state imaging element 1 is smaller than the size of the element disposition portion 41, since the protection tape 51 is pasted onto the surface of the solid-state imaging element 1 so as to make both centers be aligned with each other, the alignment can be performed accurately the same as in the case of approximately the same size.

2. Second Embodiment

<Configuration Example of the Curvature Base>

Figure 7:
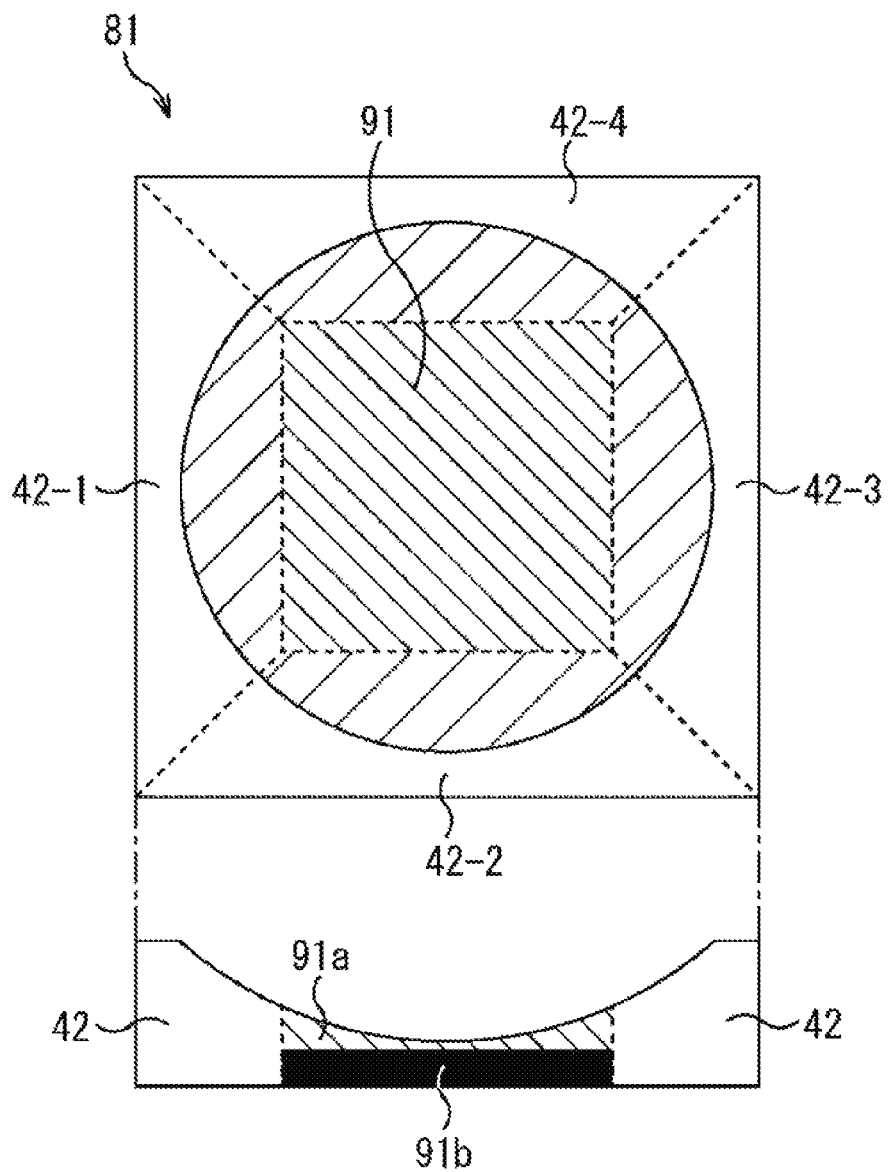
FIG. 7 is an illustration of a configuration example for a curvature base of a second embodiment in the present technology.

FIG. 7 is an illustration of another configuration example for the curvature base.

A curvature base 81 of FIG. 7 is common to the curvature base 31 of FIG. 2 in the point that the peripheral portions 42-1 to 42-4 are provided. The curvature base 81 is different from the curvature base 31 of FIG. 2 in the point that the element disposition portion 41 is replaced by an element disposition portion 91.

The element disposition portion 91 is configured to include a porous portion 91*a* and a metal-based material portion 91*b* stacked thereunder.

For example, when the porous portion 91*a* is formed of a material having a weak heat dissipation capability such as a ceramic-base material and a resin-based material, it becomes possible to improve the heat dissipation capability by stacking the metal-based material portion 91*b* under the porous portion 91*a* in this manner.

Note that the method for manufacturing the solid-state imaging element using the curvature base 81 of FIG. 7 is basically the same as the method for manufacturing described above with reference to FIG. 3 and therefore the repeated explanation will be omitted. The method for manufacturing the solid-state imaging element using the other curvature bases is also very similar.

<Variation Example>

Here, also for the curvature base 81 of FIG. 7, air is extracted by the suction through the element disposition portion 91 or the pressure from above. In this case, a ventilation hole 92 or the like may be formed on the side face as illustrated in FIG. 8A, for example, and air may be extracted from the element disposition portion 91 through the ventilation hole 92.

Figure 8:
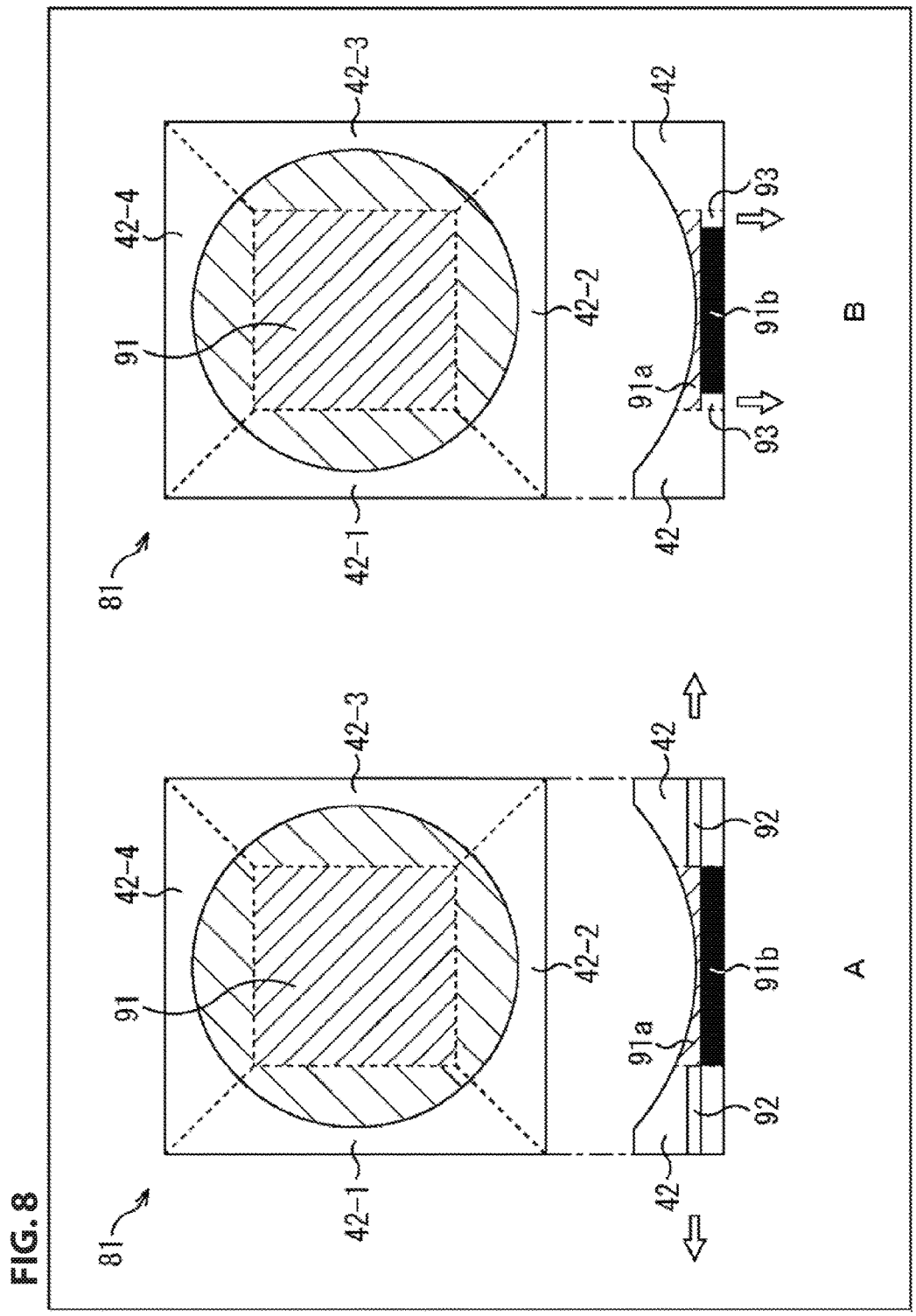
FIG. 8 is an illustration of a variation example for a curvature base.

Further, by forming the metal-based material portion 91*b* having a slightly smaller size than the porous portion 91*a* and a ventilation hole 93 or the like in the bottom face as illustrated in FIG. 8B, for example, air may be extracted from the element disposition portion 91 through the ventilation hole 93. Note that these methods for extracting air can be applied to the curvature bases having other configuration examples described in a present embodiment.

Moreover, the metal-based material portion 91*b* may be also formed in a porous state, and, in this case, air may be extracted from the element disposition portion 91 through the bottom face as in the case of the element disposition portion 41 of FIG. 2, for example, as illustrated by the arrows of FIG. 4B.

3. Third Embodiment

<Configuration Example of the Curvature Base>

Figure 9:
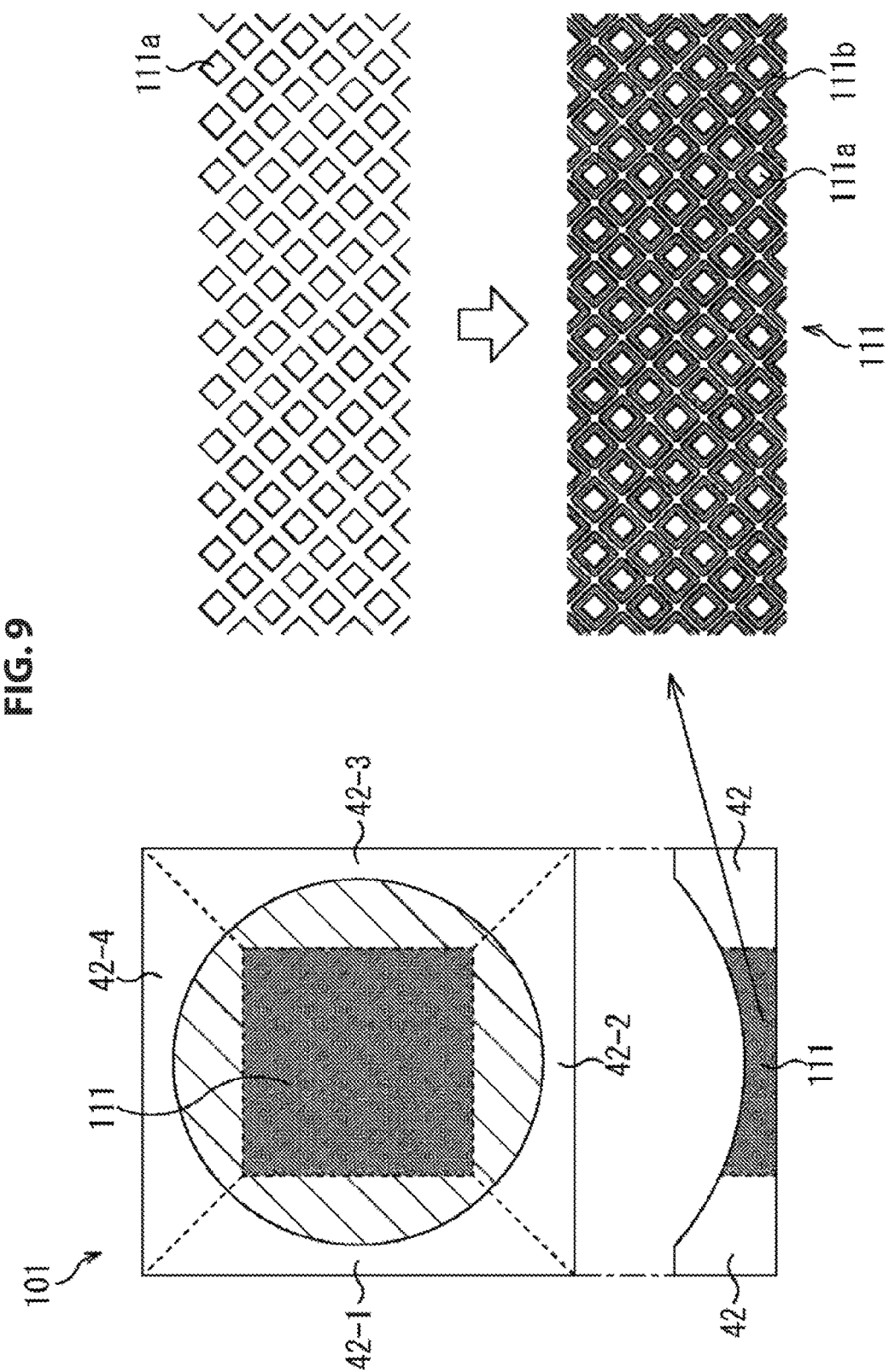
FIG. 9 is an illustration of a configuration example for a curvature base of a third embodiment in the present technology.

FIG. 9 is an illustration of another configuration example for the curvature base.

A curvature base 101 of FIG. 9 is common to the curvature base 31 of FIG. 2 in the point that the peripheral portions 42-1 to 42-4 are provided. The curvature base 101 is different from the curvature base 31 of FIG. 2 in the point that the element disposition portion 41 is replaced by an element disposition portion 111.

That is, the element disposition portion 111 is formed by forming a metal film 111*b* inside a porous portion 111*a* as illustrated in the drawing on the right side. For example, a vacuum evaporation method or the like could be used as the method for forming film of this metal film 111*b*.

When the porous portion 111*a* is formed of a material having a weak heat dissipation capability such as a ceramic-based material and a resin-based material, for example, as described above, it becomes possible to improve the heat dissipation capability by forming the metal film 111*b* inside of the porous portion 111*a*.

4. Fourth Embodiment

<Configuration Example of the Curvature Base>

Figure 10:
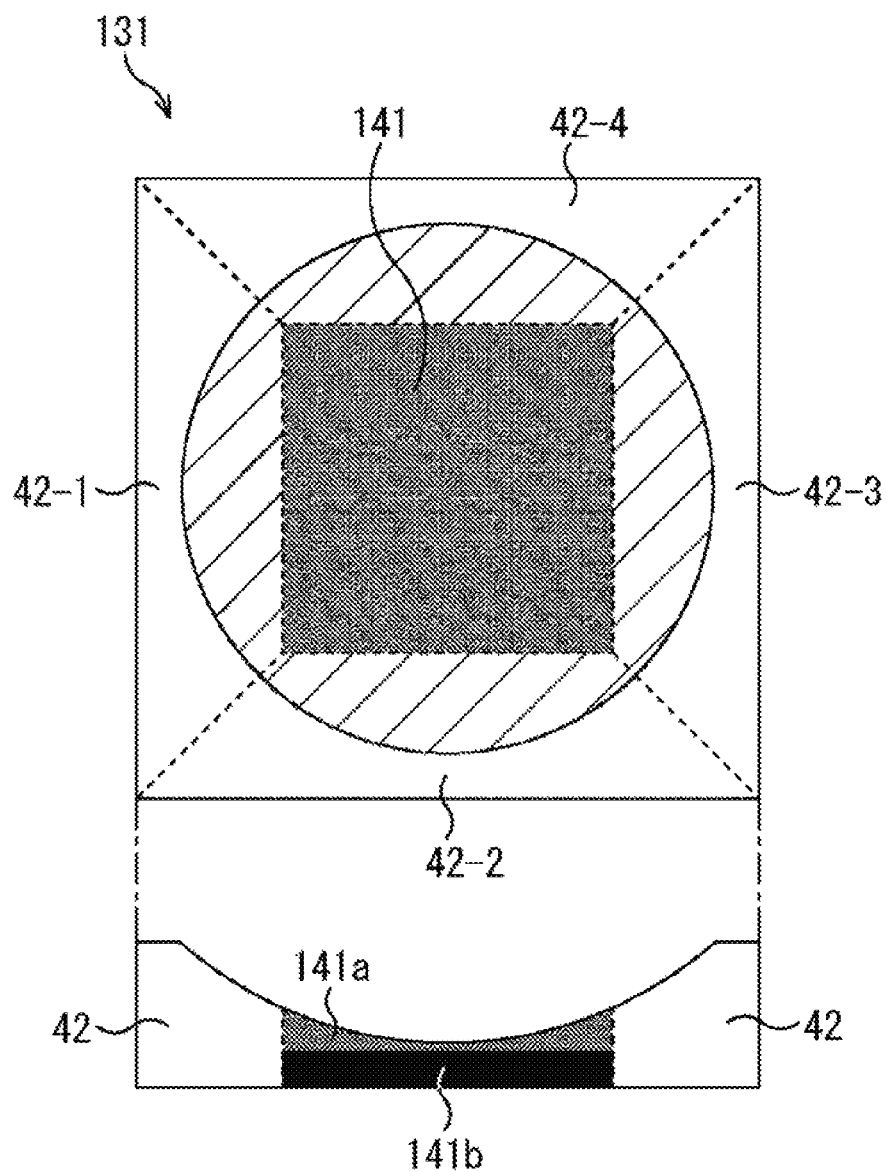
FIG. 10 is an illustration of a configuration example for a curvature base of a fourth embodiment in the present technology.

FIG. 10 is an illustration of another configuration example for the curvature base. Note that the example of FIG. 10 illustrates an example of combining the above described second embodiment and third embodiment.

A curvature base 131 of FIG. 10 is common to the curvature base 31 of FIG. 2 in the point that the peripheral portions 42-1 to 42-4 are provided. The curvature base 131 is different from the curvature base 31 of FIG. 2 in the point that the element disposition portion 41 is replaced by an element disposition portion 141.

That is, the element disposition portion 141 is configured to include a porous portion 141*a* having a metal film formed inside a porous material and a metal-based material portion 141*b* stacked under the porous portion 141*a*.

It becomes possible to further improve the heat dissipation capability by combining the above described second embodiment and third embodiment, as above.

5. Fifth Embodiment

<Configuration Example of the Curvature Base>

Figure 11:
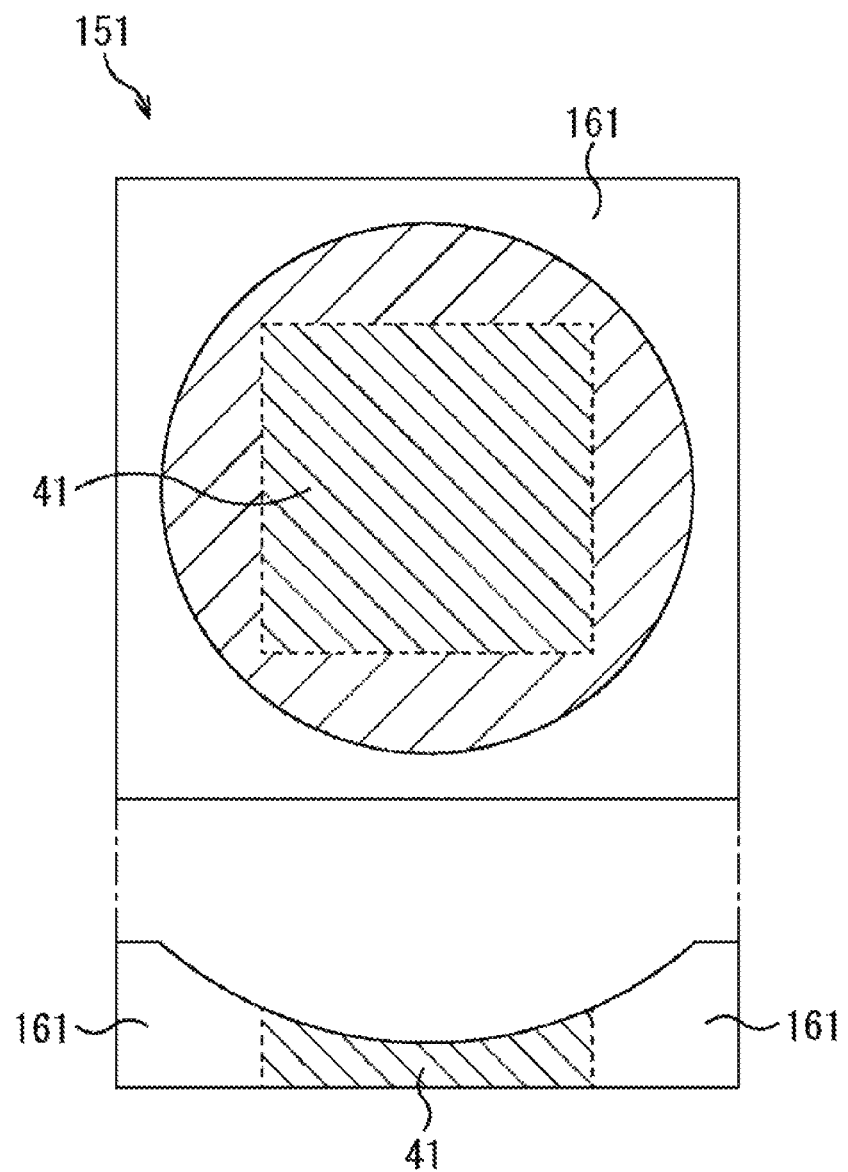
FIG. 11 is an illustration of a configuration example for a curvature base of a fifth embodiment in the present technology.

FIG. 11 is an illustration of another configuration example for the curvature base.

A curvature base 151 of FIG. 11 is common to the curvature base 31 of FIG. 2 in the point that the element disposition portion 41 is provided. The curvature base 81 is different from the curvature base 31 of FIG. 2 in the point that the four divided peripheral portions 42-1 to 42-4 are replaced by a non-divided peripheral portion 161.

In the example of FIG. 11, the curvature base 151 is divided into two portions of the element disposition portion 41 and the peripheral portion 161.

Figure 3:
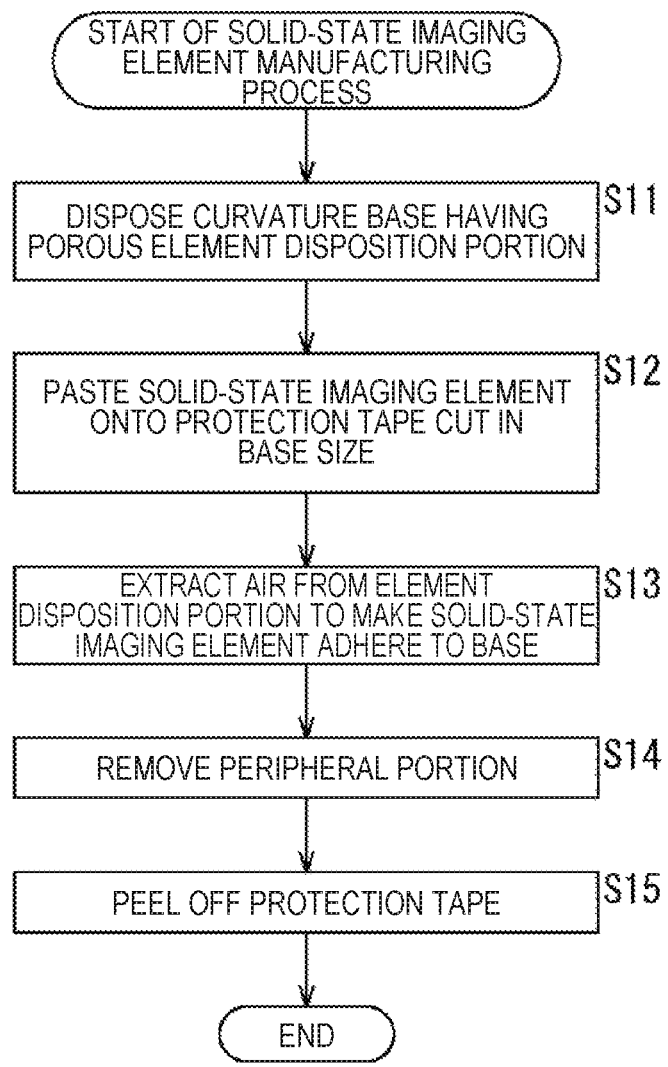
FIG. 3 is a flowchart to explain a manufacturing process of a solid-state imaging element.

That is, in the curvature base 151, in the above described step S14 of FIG. 3, for example, the element disposition portion 41 may be separated from the other portion (the peripheral portion 161). Accordingly, the curvature base 151 may be divided into any number of portions under the condition of being divided into at least two portions of the element disposition portion 41 and the other portion (the peripheral portion 161) as illustrated in FIG. 11. By dividing the curvature base 151 into the element disposition portion 41 and the other portion (the peripheral portion 161), it becomes possible to obtain the same effect as other embodiments.

By the use of the curvature base configured as above, different from the method for shrinking the volume in the opening of the base which is closed by the element chip in the state of the element chip being fixed onto the flat face of the base, for example, the margin is not necessary and therefore the theoretical yield can be improved.

Further, the base, the protection tape, and the solid-state imaging element can be aligned by the use of the outer size, and therefore the curvature yield can be improved. As a result, it becomes possible to reduce the cost of the curved solid-state imaging element.

Moreover, by the use of the porous base, it becomes possible to perform the air suction or the air escape without making holes on purpose in the process.

While, in the above, the configurations in which the present technology is applied to the CMOS solid-state imaging element have been explained, the present technology may be applied to a solid-state imaging element such as a charge coupled device (CCD) solid-state imaging element.

Note that the present technology is not limited to be applied to the solid-state imaging element, and is applied to an imaging device. Here, the imaging device means an electronic apparatus having an imaging function such as a camera system like a digital still camera and a digital video camera, and a mobile phone. Here, sometimes the imaging device also means a modular type device to be mounted on an electronic apparatus, that is, a camera module.

6. Sixth Embodiment

<Configuration Example of an Electronic Apparatus>

Here, with reference to FIG. 12, there will be explained a configuration example of an electronic apparatus in sixth embodiment of the present technology.

An electronic apparatus 300 illustrated in FIG. 12 is provided with a solid-state imaging element (element chip) 301, an optical lens 302, a shutter mechanism 303, a drive circuit 304, and a signal processing circuit 305. The solid-state imaging element formed (manufactured) by the use of the curvature base in each of the first to sixth embodiments of the present technology as described above is provided as the solid-state imaging element 301.

The optical lens 302 focuses image light from an object (incident light) onto the imaging face of the solid-state imaging element 301. Thereby, a signal charge is accumulated for a certain period within the solid-state imaging element 301. The shutter mechanism 303 controls a light irradiating period and a light blocking period for the solid-state imaging element 301.

The drive circuit 304 supplies drive signals to control the signal transfer action of the solid-state imaging element 301 and the shutter action of the shutter mechanism 303. In response to the drive signal (timing signal) supplied from the drive circuit 304, the solid-state imaging element 301 performs the signal transfer. The signal processing circuit 305 performs various kinds of signal processing for the signal output from the solid-state imaging element 301. The picture signal performed by the signal processing is stored in a storage medium like a memory or output to a monitor.

In the present specification, steps describing the described-above series of processes include not only processes which are performed chronologically in the described order but also processes which are performed in parallel or individually but not chronologically.

An embodiment of the disclosure is not limited to the embodiments described above, and various changes and modifications may be made without departing from the scope of the disclosure.

Each step described in the above-described flowcharts can be performed by a single device and can also be shared and performed by a plurality of devices.

When a plurality of processes is included in a single step, the plurality of processes included in the single step can be performed by a single device and can also be shared and performed by a plurality of devices.

A configuration described above as a single device (or processing unit) may be divided and configured as a plurality of devices (or processing units). In contrast, a configuration described above as a plurality of devices (or processing units) may be collected and configured as a single device (or processing unit). Configurations other than the above-described configurations may, of course, be added to the configurations of the devices (or the processing units). Further, as long as configurations or operations are substantially the same in the entire system, parts of the configurations of certain devices (or processing units) may be included in the configurations of the other devices (or other processing units). An embodiment of the technology is not limited to the embodiments described above, and various changes and modifications may be made without departing from the scope of the technology.

The preferred embodiments of the present disclosure have been described above with reference to the accompanying drawings, whilst the present disclosure is not limited to the above examples, of course. A person skilled in the art may find various alterations and modifications within the scope of the appended claims, and it should be understood that they will naturally come under the technical scope of the present disclosure.

Additionally, the present technology may also be configured as below.

(1)

A solid-state imaging element mounted in a curved state on a base including a porous portion.

(2)

The solid-state imaging element according to (1), wherein the base includes a metal film formed inside the porous portion.

(3)

The solid-state imaging element according to (1) or (2), wherein the base has a stacked structure of a porous material and a metal.

(4)

The solid-state imaging element according to any of (1) to (3), wherein the base is formed of a porous ceramic-based material.

(5)

The solid-state imaging element according to any of (1) to (3), wherein the base is formed of a porous metal-based material.

(6)

The solid-state imaging element according to any of (1) to (3), wherein the base is formed of a porous resin-based material.

(7)

The solid-state imaging element according to any of (1) to (6), wherein the base is curved at a center and configured to include the porous portion and the other peripheral portion which is removed in manufacturing.

(8)

A method for manufacturing a solid-state imaging element performed by a manufacturing apparatus, the method including:

aligning, to a base which is curved at a center and configured to include a porous portion and the other peripheral portion, a protection tape having a size of the base, a solid-state imaging element being pasted on the protection tape;

making the solid-state imaging element adhere to the porous portion by extracting air from the porous portion; and removing the peripheral portion from the base and peeling off the protection tape.

(9) The method for manufacturing the solid-state imaging element according to (8), wherein the solid-state imaging element is made to adhere to the porous portion by extracting air from the porous portion by suction.

(10) The method for manufacturing the solid-state imaging element according to (9), wherein air is extracted gradually from a circumference to a center of the solid-state imaging element.

(11) The method for manufacturing the solid-state imaging element according to (8), wherein the solid-state imaging element is made to adhere to the porous portion by extracting air from the porous portion by pressurization from above the protection tape.

(12) The method for manufacturing the solid-state imaging element according to (11), wherein air is extracted gradually from a center to a circumference of the solid-state imaging element.

(13) The method for manufacturing the solid-state imaging element according to any of (8) to (12), wherein the porous portion includes a metal film formed inside the porous portion.

(14) The method for manufacturing the solid-gate imaging element according to any of (8) to (13), wherein the porous portion has a stacked structure of a porous material and a metal.

(15) The method for manufacturing the solid-gate imaging element according to any of (8) to (14), wherein the porous portion is formed of a ceramic-based material.

(16) The method for manufacturing the solid-state imaging element according to any of (8) to (14), wherein the porous portion is formed of a metal-based material.

(17) The method for manufacturing the solid-state imaging element according to any of (8) to (14), wherein the porous portion is formed of a ceramic-based material.

(18) An electronic apparatus, including:

a solid-state imaging element mounted in a curved state on a porous base;

a signal processing circuit that processes an output signal output from the solid-state imaging element; and an optical system that makes incident light enter the solid-state imaging element.

REFERENCE SIGNS LIST 1 solid-state imaging element
2 pixel
3 pixel region
11 semiconductor substrate
31 curvature base
41 element disposition portion
42, 42-1 to 42-4 peripheral portion
51 protection tape
52 adhesion layer
81 curvature base
91 element disposition portion
91a porous portion
91b metal-based material portion
92, 93 ventilation hole
101 curvature base
111 element disposition portion
111a porous portion
111b metal film
131 curvature base
141 element disposition portion
141a porous portion
141b metal-based material portion
151 curvature base
161 peripheral portion
300 electronic apparatus
301 solid-state imaging element
302 optical lens
303 shutter mechanism
304 drive circuit
305 signal processing circuit

The invention claimed is:

1. A solid-state imaging element, comprising:
a first surface configured to receive light; and
a second surface opposite to the first surface,
wherein the second surface of the solid-state imaging element is mounted in a curved state on a porous portion of a base, wherein the porous portion is on a metal portion of the base, wherein a size of the metal portion is less than a size of the porous portion,
wherein an adhesive layer is between the solid-state imaging element and the porous portion, and
wherein a size of the adhesive layer, a size of the solid-state imaging element and the size of the porous portion are same.

2. The solid-state imaging element according to claim 1, wherein the second surface of the solid-state imaging element is mounted on the porous portion that includes a metal film.

3. The solid-state imaging element according to claim 1, wherein the second surface of the solid-state imaging element is mounted on the porous portion that is curved at a center.

4. The solid-state imaging element according to claim 1, wherein the second surface of the solid-state imaging element is mounted on the porous portion that comprises a porous ceramic-based material.

5. The solid-state imaging element according to claim 1, wherein the second surface of the solid-state imaging element is mounted on the porous portion that comprises a porous metal-based material.

6. The solid-state imaging element according to claim 1, wherein the second surface of the solid-state imaging element is mounted on the porous portion that comprises a porous resin-based material.

7. A method for manufacturing a solid-state imaging element, the method comprising:
aligning, to a base which is curved at a center and which comprises a porous portion and a peripheral portion, a protection tape, wherein the solid-state imaging element is on the protection tape;

making the solid-state imaging element adhere to the porous portion by extracting air via the porous portion based on suction, wherein the air is extracted gradually from a circumference of the solid-state imaging element to a center of the solid-state imaging element;

removing the peripheral portion from the base; and peeling off the protection tape from the solid-state imaging element.

8. The method for manufacturing the solid-state imaging element according to claim 7, wherein the porous portion includes a metal film.

9. The method for manufacturing the solid-state imaging element according to claim 7, wherein the porous portion has a stacked structure of a porous material and a metal.

10. The method for manufacturing the solid-state imaging element according to claim 7, wherein the porous portion comprises a ceramic-based material.

11. The method for manufacturing the solid-state imaging element according to claim 7, wherein the porous portion comprises a metal-based material.

12. The method for manufacturing the solid-state imaging element according to claim 7, wherein the porous portion comprises a resin-based material.

13. An electronic apparatus, comprising:

a base that includes a metal portion and a porous portion on the metal portion, wherein a size of the metal portion is less than a size of the porous portion;

a solid-state imaging element mounted in a curved state on the porous portion;

an adhesive layer between the solid-state imaging element and the porous portion, wherein a size of the adhesive layer, a size of the solid-state imaging element and the size of the porous portion are same;

a signal processing circuit configured to process an output signal from the solid-state imaging element; and an optical system configured to focus incident light to the solid-state imaging element.

14. The electronic apparatus according to claim 13, wherein the porous portion includes a metal film.

15. The electronic apparatus according to claim 13, wherein the metal portion is porous.

16. A method for manufacturing a solid-state imaging element, the method comprising:

aligning, to a base which is curved at a center and which comprises a porous portion and a peripheral portion, a protection tape, wherein the solid-state imaging element is on the protection tape;

making the solid-state imaging element adhere to the porous portion by extracting air via the porous portion based on pressurization from above the protection tape, wherein the air is extracted gradually from a center of the solid-state imaging element to a circumference of the solid-state imaging element;

removing the peripheral portion from the base; and peeling off the protection tape from the solid-state imaging element.

* * * * *